United States Patent
Herman

(10) Patent No.: US 9,194,901 B2
(45) Date of Patent: Nov. 24, 2015

(54) SENSING STRUCTURE OF TOUCH PANEL

(71) Applicant: SITRONIX TECHNOLOGY CORP., Hsinchu County (TW)

(72) Inventor: Herman, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 97 days.

(21) Appl. No.: 13/785,547

(22) Filed: Mar. 5, 2013

(65) Prior Publication Data

US 2013/0234738 A1    Sep. 12, 2013

Related U.S. Application Data

(60) Provisional application No. 61/608,176, filed on Mar. 8, 2012.

(51) Int. Cl.
*G01R 27/26* (2006.01)
*G06F 3/044* (2006.01)
*G02F 1/1333* (2006.01)

(52) U.S. Cl.
CPC .......... *G01R 27/2605* (2013.01); *G06F 3/044* (2013.01); *G02F 1/13338* (2013.01)

(58) Field of Classification Search
CPC ....... G06F 3/044; G06F 3/045; G06F 3/0412; G06F 2203/04103; G06F 2203/04111; G06F 2203/04112; G06F 3/0418; G06F 3/041; H05K 3/30; H01H 13/83; G02F 1/13338; G01R 27/2605

USPC ............ 324/686; 345/104, 173–178; 349/17; 178/18.06–19.03; 29/846, 464; 430/319; 216/13, 17; 427/58, 216; 428/195.1; 257/40–41; 438/100
See application file for complete search history.

(56) References Cited

U.S. PATENT DOCUMENTS

| | | | | |
|---|---|---|---|---|
| 6,297,811 B1* | 10/2001 | Kent et al. | ...................... | 345/173 |
| 7,864,160 B2* | 1/2011 | Geaghan et al. | ............... | 345/173 |
| 2007/0008299 A1* | 1/2007 | Hristov | .......................... | 345/173 |
| 2011/0148780 A1* | 6/2011 | Lu et al. | ......................... | 345/173 |
| 2011/0193448 A1* | 8/2011 | Saruban et al. | ............... | 310/311 |
| 2011/0193791 A1* | 8/2011 | Tong et al. | ..................... | 345/173 |
| 2012/0062472 A1* | 3/2012 | Yilmaz | .......................... | 345/173 |

OTHER PUBLICATIONS

English (machine translation) Liu Baiyuan; Xie Minglun (Inventors). AU Optronics Corp. (Assignee). Touch display device and touch device CN 101833404 A. (Published Sep. 15, 2010).*

* cited by examiner

*Primary Examiner* — Melissa Koval
*Assistant Examiner* — Felicia Farrow
(74) *Attorney, Agent, or Firm* — Rosenberg, Klein & Lee

(57) ABSTRACT

The present invention relates to a sensing structure of touch panel, which comprises a plurality of electrode groups disposed on a substrate. The substrate has a first side and a second side. Each electrode group comprises a first external electrode, a second external electrode, a plurality of internal electrodes, and a plurality of wires. The first external electrode is disposed on a first side; the second external electrode is disposed on the second side; the plurality of internal electrodes are disposed between the first external electrode and the second external electrode; and the plurality of wires are disposed on both sides of the electrode group alternately. Thereby, by disposing the first external electrode, the second external electrode, and the internal electrodes, all being zigzag, the disposable number of electrodes in each electrode group is increased. Accordingly, the sensitivity of touch sensing for the sensing structure of touch panel is enhanced.

12 Claims, 8 Drawing Sheets

SENSING STRUCTURE OF TOUCH PANEL

REFERENCE TO RELATED APPLICATION

This Application is based on Provisional Patent Application Ser. No. 61/608,176, filed 8 Mar. 2012, currently pending.

FIELD OF THE INVENTION

The present invention relates generally to a structure of touch panel, and particularly to a sensing structure of touch panel.

BACKGROUND OF THE INVENTION

In recent years, various electronic products are being developed in the trend of easy operation, small size, and large screen. In particular, for portable electronic products, the requirements in volume and screen size are extremely strict. Thereby, many electronic products integrate the touch panel with the LCD panel in order to save the area required by keyboards or keypads and thus enlarging the disposable area on the screen.

Depending on their sensing principle, general touch panels can be categorized into resistive, capacitive, infrared, and ultrasonic types. Thanks to their advantages of dust repellence, scratch resistance, and high resolution, capacitive touch panels are increasingly adopted by electronic devices.

The principle of a capacitive touch panel is mainly to coat a layer of transparent conductive thin film, such as indium-tin oxide, on the surface of a glass substrate as the sensing structure. When a user touches the panel using his finger, the proximity of the finger changes the coupling capacitor of the sensing structure. Then the capacitive touch panel can determine the touched location by the finger according to the analysis of the capacitance variation in the sensing structure.

Nonetheless, a double-layer capacitive touch sensor requires disposing electrodes on the top and bottom surfaces of the glass substrate, respectively, and hence leading to the drawbacks of higher manufacturing costs and complicated processes. In order to solve the problems of the double-layer capacitive touch sensor, the single-layer capacitive touch sensor is developed.

The single-layer capacitive touch sensing structure according to the prior art is composed by two electrode groups. The first electrode group is composed by a first electrode and a second electrode only; the second electrode group is composed by a third electrode and a fourth electrode only. Thereby, it has only two touch locations, which limit its sensitivity. Besides, the shape of the first, second, third, or fourth electrodes is suitable for paired electrodes only, which disallows increase in the electrode number in each electrode group and hence enhancement in the sensitivity of touch sensing. In addition, the layout of its wires shrinks the area for the electrodes, making it is not possible to increase the sensitivity of touch sensing by disposing more electrodes in each electrode group. Thereby, there is still room for improvement for the single-layer capacitive touch sensing structure according to the prior art.

Accordingly, for solving the problems described above, the present invention provides a sensing structure of touch panel by using the shape of its electrodes and the layout of wires. Hence, two or more electrodes can be disposed in each electrode group for enhancing the sensitivity of touch sensing.

SUMMARY

An objective of the present invention is to provide a sensing structure of touch panel, which uses the shape of its electrodes and the layout of wires for disposing two or more electrodes in each electrode group and thus enhancing the sensitivity of touch sensing.

Another objective of the present invention is to provide a sensing structure of touch panel, which increases the touch operation region in each electrode group for enhancing the accuracy of touch sensing.

Still another objective of the present invention is to provide a sensing structure of touch panel, which increases the touch operation region in each electrode group for enhancing the accuracy of multi-touch sensing.

Another objective of the present invention is to provide a sensing structure of touch panel, which shrinks the width of wires for reducing the area of the wires in the electrode groups. By using this method, the problem of reduced area for electrodes caused by excess wires while disposing multiple electrodes in the electrode groups can be thereby solved.

For achieving the objectives described above and their effects, the present invention discloses a sensing structure of touch panel, which comprises a plurality of electrode groups disposed on a substrate. The substrate has a first side and a second side corresponding to each other. Each electrode group comprises a first external electrode, a second external electrode, and a plurality of internal electrodes. The first external electrode is disposed on the first side and has a first external main electrode and a first external sub electrode. The first external sub electrode is connected to one side of the first external main electrode. Besides, the first external sub electrode is zigzag and faces the second side. The second external electrode is disposed on the second side and has a second external main electrode and a second external sub electrode. The second external sub electrode is connected to one side of the second external main electrode. Besides, the second external sub electrode is zigzag and faces the first side. The plurality of internal electrodes are disposed between the first external electrode and the second external electrode, and have an internal main electrode, a first internal sub electrode, and a second internal sub electrode, respectively. The first internal sub electrode is connected to one side of the internal main electrode. Besides, the first internal sub electrode is zigzag and faces the first side. The second internal sub electrode is connected to the other side of the internal main electrode. Besides, the second internal sub electrode is zigzag and faces the second side. The plurality of internal electrodes are arranged in series. In addition, the first internal sub electrode of a first internal electrode of the plurality of internal electrodes and the first external sub electrode are complementary and electrically isolated. Thereby, according to the present invention, the disposable number of electrodes in each electrode group can be increased by disposing the first external electrode, the second external electrode, and the internal electrodes, all having zigzag sub electrodes, in each electrode group. Hence, the sensitivity of touch sensing for the sensing structure of touch panel can be enhanced as well. Moreover, by increasing the touch operation region in each electrode group, the sensitivity and accuracy of touch sensing are increased. Furthermore, by increasing the touch operation region in each electrode group, more accurate multi-touch capability is thus provided.

Besides, the electrode groups further comprise a plurality of wires coupled to the first external electrode, the second external electrode, and the plurality of internal electrodes, respectively, and extending from the first side to the second side; the plurality of wires are disposed on both sides of the electrode groups alternately. After passing the length of an internal electrode, the widths of the plurality of wires are reduced. Thereby, by disposing the wires on both sides of the electrode groups alternately and by reducing the widths of the plurality of wires after passing the length of an internal electrode, the area occupied by the wires in each electrode group is reduced. Hence, the disposable number of electrodes in each electrode group can be increased.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
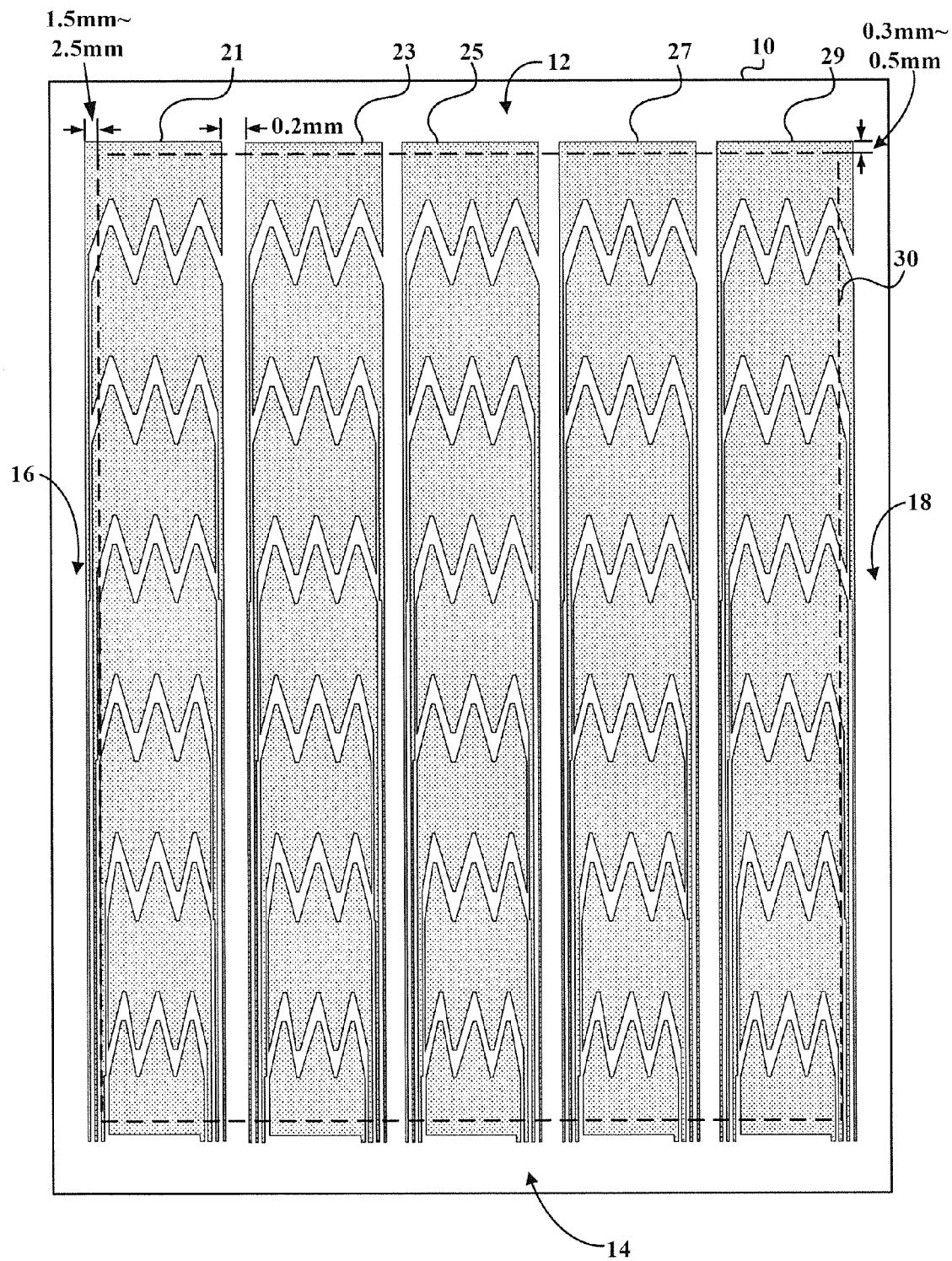
FIG. 1 shows a schematic diagram of the sensing structure of touch panel according to a preferred embodiment of the present invention.

FIG. 1 shows a schematic diagram of the sensing structure of touch panel according to a preferred embodiment of the present invention. As shown in FIG. 1, the sensing structure of touch panel according to the present invention comprises a substrate 10 and a plurality of electrode groups 21, 23, 25, 27, 29. The substrate 10 has a first side 12 and a second side 14 corresponding to each other and has a third side 16 and a fourth side 18 corresponding to each other. The plurality of electrode groups 21, 23, 25, 27, 29 are arranged in parallel on the substrate 10 with a distance therebetween. According to the present embodiment, the distance between the plurality of electrode groups 21, 23, 25, 27, 29 is selected to be 0.2 millimeter. In addition, a visible region 30 according to the present embodiment is slightly smaller than the sensing structure of touch panel according to the present invention. The distance between the first side 12 or the second side 14 of the plurality of electrode groups 21, 23, 25, 27, 29 and the visible region 30 is between 0.3 and 0.5 millimeter; the distance between the third side 16 or the fourth side 18 of the plurality of electrode groups 21, 23, 25, 27, 29 and the visible region 30 is between 1.5 and 2.5 millimeters.

Figure 2:
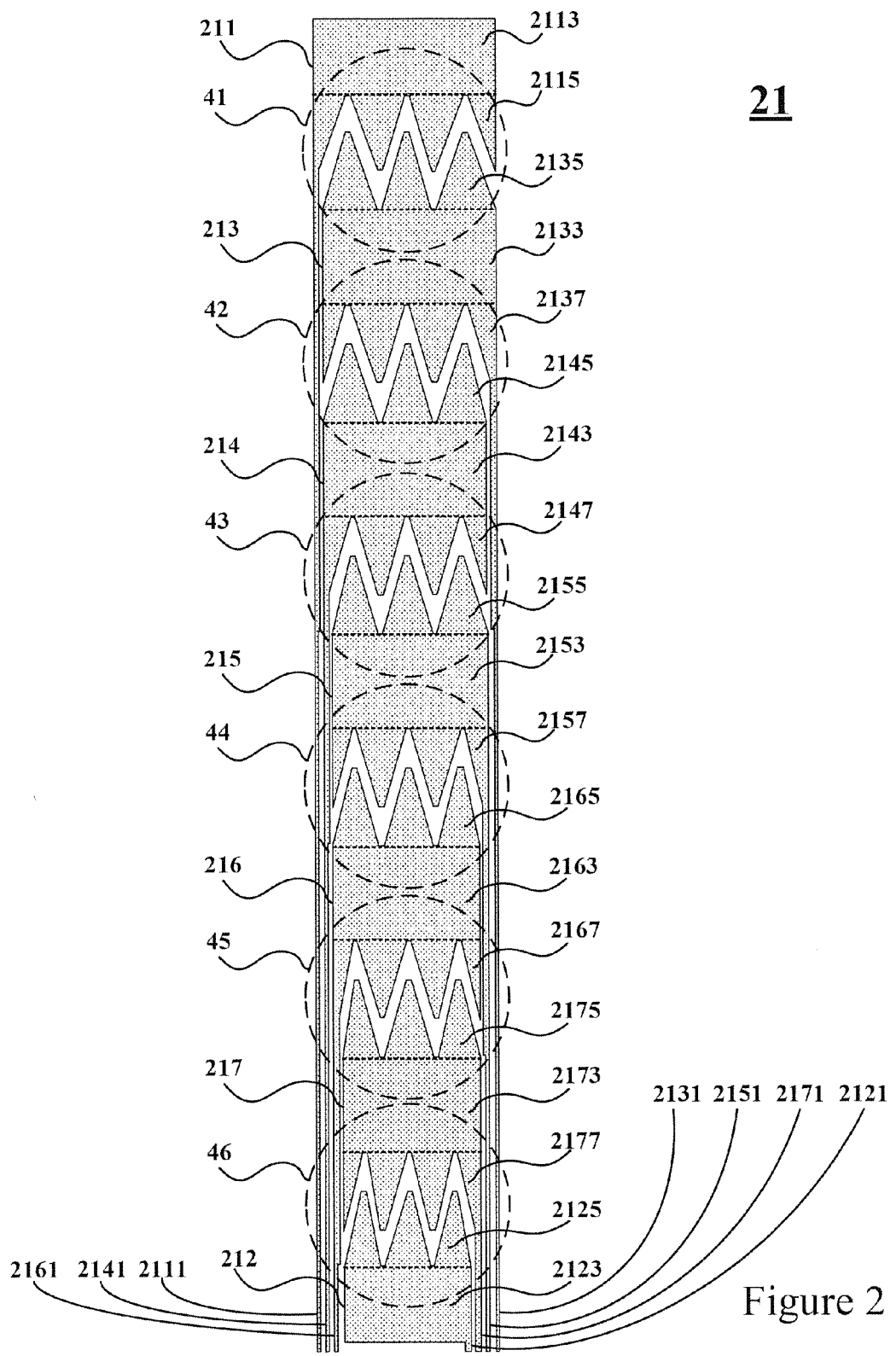
FIG. 2 shows a schematic diagram of the respective electrode group in the sensing structure of touch panel according to a preferred embodiment of the present invention.

FIG. 2 shows a schematic diagram of the respective electrode group in the sensing structure of touch panel according to a preferred embodiment of the present invention. Because the structures of the electrode groups 21, 23, 25, 27, 29 are identical, the electrode group 21 is used for description in the present embodiment. As shown in FIG. 2, the electrode group 21 comprises a first external electrode 211, a second external electrode 212, and a plurality of internal electrodes 213, 214, 215, 216, 217.

The first external electrode 211 is located on the first side 12 of the substrate 10 and has a first external main electrode 2113 and a first external sub electrode 2115. The first external sub electrode 2115 is connected to one side of the first external main electrode 2113. Besides, the first external sub electrode 2115 is zigzag and faces the second side 14 of the substrate 10. In other words, a first side of the first external sub electrode 2115 is connected with the first external main electrode 2113; the opposite side of the first side of the first external sub electrode 2115 is zigzag and faces the second side 14 of the substrate 10.

The second external electrode 212 is located on the second side 14 of the substrate 10 and has a second external main electrode 2123 and a second external sub electrode 2125. The second external sub electrode 2125 is connected to one side of the second external main electrode 2123. Besides, the second external sub electrode 2125 is zigzag and faces the first side 12 of the substrate 10. In other words, a first side of the second external sub electrode 2125 is connected with the second external main electrode 2123; the opposite side of the first side of the second external sub electrode 2125 is zigzag and faces the first side 12 of the substrate 10.

The plurality of internal electrodes 213, 214, 215, 216, 217 are disposed between the first and second external electrodes 211, 212. The internal electrode 213 has an internal main electrode 2133, a first internal sub electrode 2135, and a second internal sub electrode 2137. The first internal sub electrode 2135 is connected to one side of the internal main electrode 2133. Besides, the first internal sub electrode 2135 is zigzag and faces the first side 12 of the substrate 10. The second internal sub electrode 2137 is connected to the other side of the internal main electrode 2133 and faces the second side 14 of the substrate 10. Because the structures of the plurality of internal electrodes 213, 214, 215, 216, 217 are identical, the internal electrode 213 is used for description in the present embodiment. The plurality of internal electrodes 213, 214, 215, 216, 217 are arranged in series. In addition, the first internal sub electrode 2135 of the first internal electrode in the plurality of internal electrodes 213, 214, 215, 216, 217, namely, the internal electrode 213 according to the present embodiment, and the first external sub electrode 2115 of the first external electrode 211 are complementary and electrically isolated from each other; the second internal sub electrode 2177 of the last internal electrode in the plurality of internal electrodes 213, 214, 215, 216, 217, namely, the internal electrode 217 according to the present embodiment, and the second external sub electrode 2125 of the second external electrode 212 are complementary and electrically isolated from each other. The so-called "complementary" according to the present invention means that the top of the zigzag electrode corresponds to the bottom of the complementary zigzag electrode. For example, in the above description, the top of the first internal sub electrode 2135 of the internal electrode 213 corresponds to the bottom of the first external sub electrode 2115 of the first external electrode 211; the top of the first external sub electrode 2115 corresponds to the bottom of the first internal sub electrode 2135. Alternatively, the top of the second internal sub electrode 2177 of the internal electrode 217 corresponds to the bottom of the second external sub electrode 2125 of the second external electrode 212; the top of the second external sub electrode 2125 corresponds to the bottom of the second internal sub electrode 2177.

Thereby, by disposing the first external electrode 211, the second external electrode 212, and the plurality of internal electrodes 213, 214, 215, 216, 217, all having zigzag sub electrodes, in the electrode group 21, the disposable number of electrodes in the electrode group 21 is increased. Accordingly, the sensitivity of touch sensing for the sensing structure of touch panel is enhanced.

According to the above description, the electrode group 21 according to the present invention comprises a plurality of touch operation regions 41, 42, 43, 44, 45, 46. Namely, the touch operation region 41 is formed between the first external sub electrode 2115 and the first internal sub electrode 2135; the touch operation region 42 is formed between the second internal sub electrode 2137 and the first internal sub electrode 2145; the touch operation region 43 is formed between the second internal sub electrode 2147 and the first internal sub electrode 2155; the touch operation region 44 is formed between the second internal sub electrode 2157 and the first internal sub electrode 2165; the touch operation region 45 is formed between the second internal sub electrode 2167 and the first internal sub electrode 2175; and the touch operation region 46 is formed between the second internal sub electrode 2177 and the second external sub electrode 2125. According to the present invention, the zigzag edges of the first external sub electrode 2115 are interlaced with the zigzag edges of the first internal electrode 2135 and forming the touch operation region. Thereby, when the touch object touches this touch operation region, the location of the touch object in the touch operation region can be calculated by interpolation. According to the present embodiment, there are six touch operation regions in each electrode group of the touch panel for increasing the sensitivity and accuracy of touch sensing. Moreover, because the number of the touch operation regions in each electrode group is increased, the multi-touch capability is allowed in each electrode group. That is to say, more accurate multi-touch capability is provided for the touch panel.

According to the present embodiment, the first external electrode 211, the second external electrode 212, and the plurality of internal electrodes 213, 214, 215, 216, 217 are, but not limited to, indium-tin-oxide thin-film electrodes. Other electrode materials can also be adopted.

In addition, in order to let the touch panel have more consistent light transmittivity, dummy electrodes can be disposed between the first external sub electrode 2115 and the first internal sub electrode 2135, the second internal sub electrode 2137 and the first internal sub electrode 2145, the second internal sub electrode 2147 and the first internal sub electrode 2155, the second internal sub electrode 2157 and the first internal sub electrode 2165, the second internal sub electrode 2167 and the first internal sub electrode 2175, and the second internal sub electrode 2177 and the second external sub electrode 2125.

Figure 3:
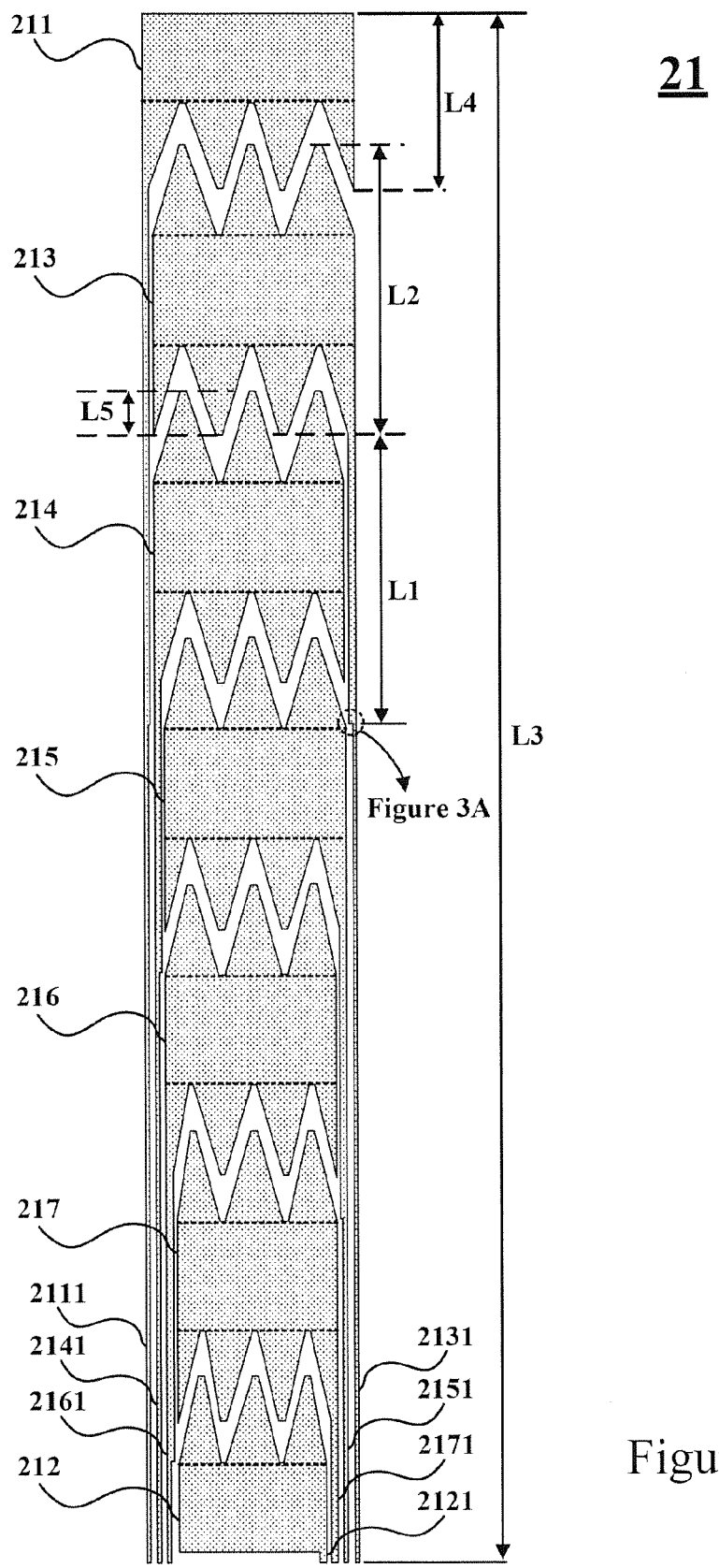
FIG. 3 shows a schematic diagram of the length of the electrode in the sensing structure of touch panel according to a preferred embodiment of the present invention.
Figure 3A:
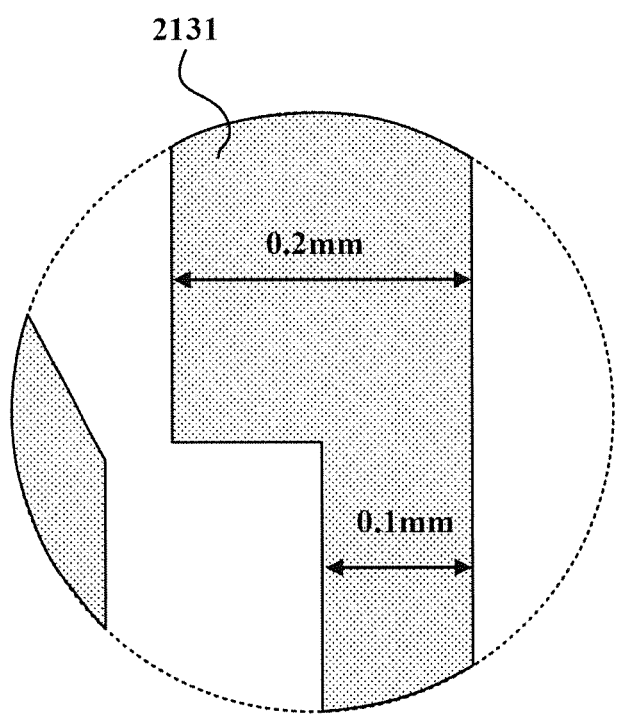
FIG. 3A shows a schematic diagram of reduction in the width of the wire of the touch panel according to a preferred embodiment of the present invention.

FIG. 3 shows a schematic diagram of the length of the electrode in the sensing structure of touch panel according to a preferred embodiment of the present invention. As shown in the figure, the electrode group 21 further comprises a plurality of wires 2111, 2121, 2131, 2141, 2151, 2161, 2171 coupled to the first external electrode 211, the second external electrode 212, and the plurality of internal electrodes 213, 214, 215, 216, 217, respectively, and extending from the first side 12 of the substrate 10 to the second side 14. Besides, the plurality of wires 2111, 2121, 2131, 2141, 2151, 2161, 2171 are disposed alternately on both sides of the electrode group 21. The wire 2111 is coupled to the first external electrode 211; the wire 2121 is coupled to the second external electrode 212; the wire 2131 is coupled to the internal electrode 213; the wire 2141 is coupled to the internal electrode 214; the wire 2151 is coupled to the internal electrode 215; the wire 2161 is coupled to the internal electrode 216; and the wire 2171 is coupled to the internal electrode 217. In addition, the initial width of the plurality of wires 2111, 2121, 2131, 2141, 2151, 2161, 2171 coupled to the first external electrode 211, the second external electrode 212, and the internal electrodes 213, 214, 215, 216, 217 is selected to be 0.2 millimeter. FIG. 3A shows a schematic diagram of reduction in the width of the wire 2131. After the wire 2131 passes the length L1 of an internal electrode, its width is reduced to 0.1 millimeter. By shrinking the width of the wire 2131, the area occupied by the wire 2131 in the electrode group 21 is reduced. By using this method, the problem of reduced area for electrodes caused by excess wires while disposing multiple electrodes in the electrode groups can be thereby solved. The reduction method for the rest wires 2111, 2121, 2141, 2151, 2161, 2171 is the same as for the wire 2131. Hence, the details will not be described again.

The present invention shrinks the width of the wires 2111, 2121, 2141, 2151, 2161, 2171, the area occupied by them in the electrode group 21 is reduced. By using this method, the problem of reduced area for electrodes caused by excess wires while disposing multiple electrodes in the electrode groups can be thereby solved.

Besides, the sensing structure of touch panel according to the present invention can be applied to one-glass sensors or film-type sensors. When applied to one-glass sensors, the thickness of the glass is selected from the range between 0.8 and 1.1 millimeters; as for film-type sensors, the thickness of the glass plus that of the adhesion layer is selected from the range between 0.8 and 1.1 millimeters.

Moreover, the length L4 of the external electrode is the length of the first external electrode 211 or the second external electrode 212 along the direction from the first side 12 to the second side 14. The length L4 of the external electrode is the overall length L3 of the electrode group divided by the total number of the internal electrodes plus two, then multiplied by 75%, and added by a half of the overlap length L5. Namely, $L4=L3\div(5+2)*0.75+0.5*L5$. The overlap length L5 is the length of the complementary and overlap portion between the first external sub electrode 2115 and the first internal sub electrode 2135, between the second external sub electrode 2125 and the second internal sub electrode 2177, or between the internal electrodes 213, 214, 215, 216, 217 (the second internal sub electrode 2137 and the first internal sub electrode 2145, the second internal sub electrode 2147 and the first internal sub electrode 2155, the second internal sub electrode 2157 and the first internal sub electrode 2165, and the second internal sub electrode 2167 and the first internal sub electrode 2175). Furthermore, the overlap length is selected from the range between 2 and 8 millimeters.

The length L1 of the internal electrode is equal to the length L2 of the internal electrode, and is the length of each of the internal electrodes 213, 214, 215, 216, 217 along the direction from the first side 12 to the second side 14. The length of the internal electrode L1 is equal to the overall length L3 of the electrode group minus twice the length L4 of the external electrode and plus the overlap length L5, then divided by the total number of the internal electrodes, which is 5 according to the present embodiment, and finally plus the overlap length L5. In other words, $L1=L2=(L3-2*L4+L5)\div5+L5$.

Figure 4:
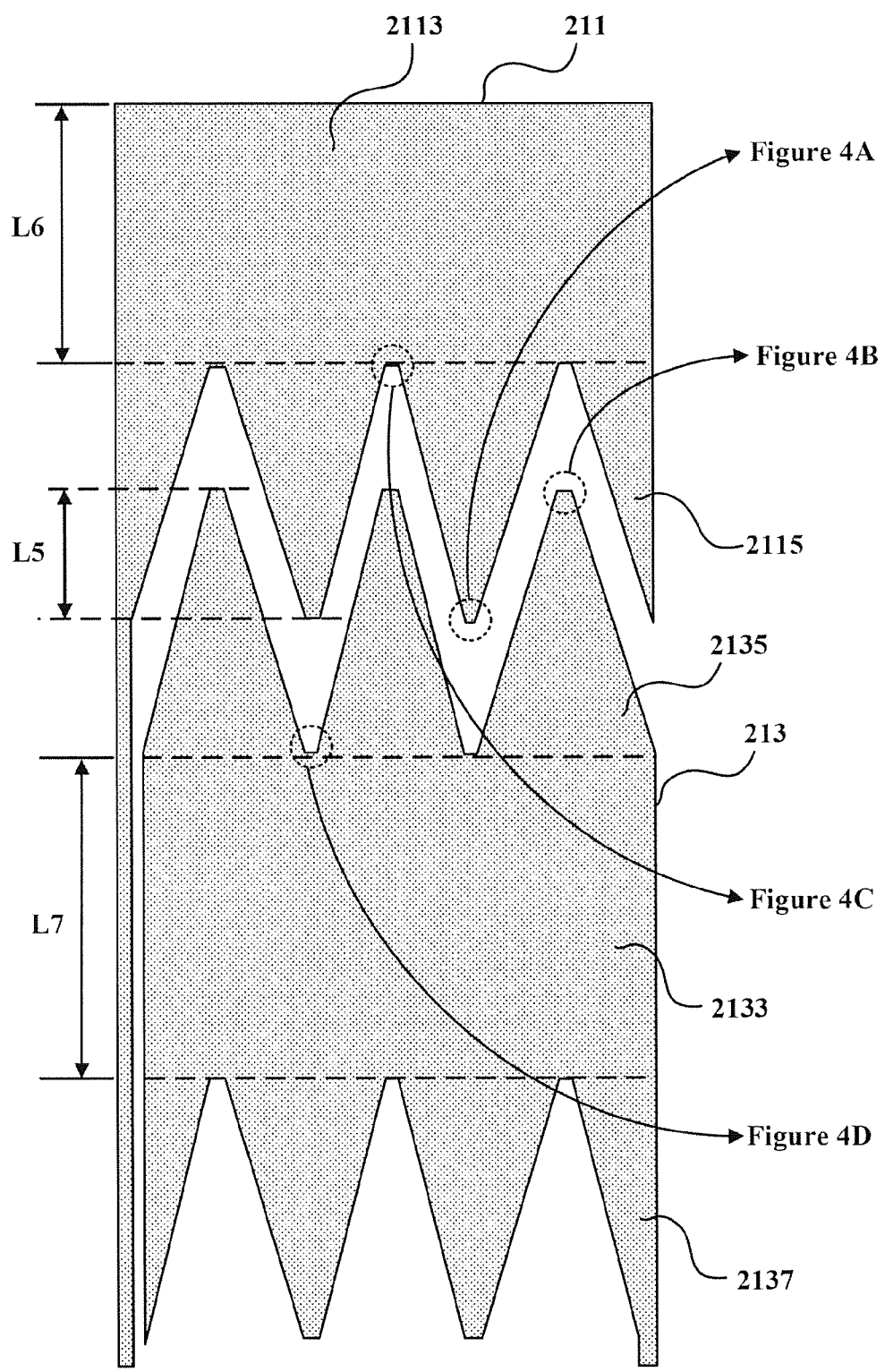
FIG. 4 shows a schematic diagram of the sub electrode in the touch panel according to a preferred embodiment of the present invention.
Figure 4A:
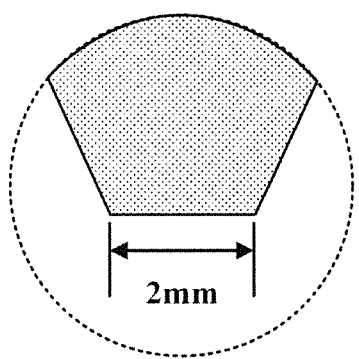
FIGS. 4A and 4B show schematic diagrams of the top of the trapezoid electrode in the touch panel according to a preferred embodiment of the present invention.
Figure 4B:
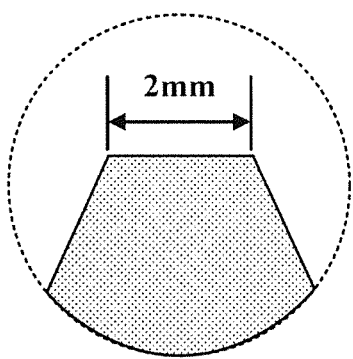
Figure 4C:
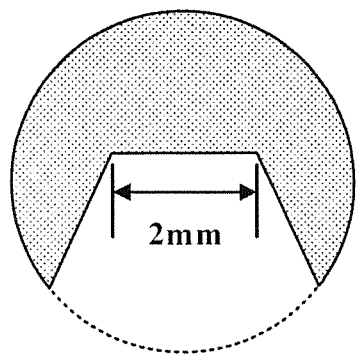
FIGS. 4C and 4D show schematic diagrams of the spacing of the trapezoid electrode in the touch panel according to a preferred embodiment of the present invention.
Figure 4D:
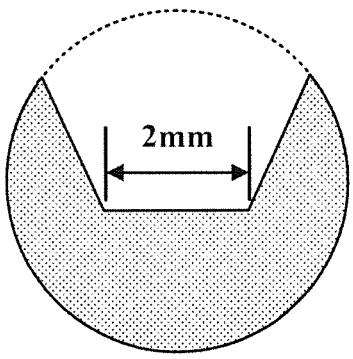

FIG. 4 shows a schematic diagram of the sub electrode in the touch panel according to a preferred embodiment of the present invention. The first external sub electrode 2115, the second external sub electrode 2125, the first internal sub electrodes 2135, 2145, 2155, 2165, 2175 or the second internal sub electrodes 2137, 2147, 2157, 2167, 2177 are zigzag electrodes comprising a plurality of trapezoid electrodes. According to the present embodiment, only the first external sub electrode 2115, the first internal sub electrode 2135, and the second internal sub electrode 2137 are used for description. A plurality of trapezoid electrodes of the first external sub electrode 2115 are arranged in parallel and connected to one side of the first external main electrode 2113 with a spacing therebetween; a plurality of trapezoid electrodes of the first internal sub electrode 2135 are arranged in parallel and connected to one side of the internal main electrode 2133 with a spacing therebetween; and a plurality of trapezoid electrodes of the second internal sub electrodes 2137 are arranged in parallel and connected to the other side of the internal main electrode 2133 with a spacing therebetween. FIGS. 4A and 4B show schematic diagrams of the top of the trapezoid electrodes. As shown in the figures, the width of the top of the trapezoid electrodes is selected to be 2 millimeters. FIGS. 4C and 4D show schematic diagrams of the spacing of the trapezoid electrodes. As shown in the figures, the spacing between the plurality of trapezoid electrodes is selected to be 2 millimeters.

In addition, the length of the first external main electrode 2113 of the first external electrode 211 along the direction from the first side 12 to the second side 14 is equal to the second external main electrode 2123 of the second external electrode 212. According to the present embodiment, only the length L6 of the first external main electrode 2113 is used for description. The length L6 of the first external main electrode 2113 is selected from the range between 2 and 4.5 millimeters. The lengths of the internal main electrodes 2133, 2143, 2153, 2163, 2173 of the internal electrodes 213, 214, 215, 216, 217 along the direction from the first side 12 to the second side 14 are identical. Thereby, in the present embodiment, only the length L7 of the internal main electrode 2133 is used for description. The length L7 of the internal main electrode 2133 is selected from the range between 4 and 6 millimeters; the overlap length L5 is selected from the range between 2 and 4 millimeters.

Figure 5:
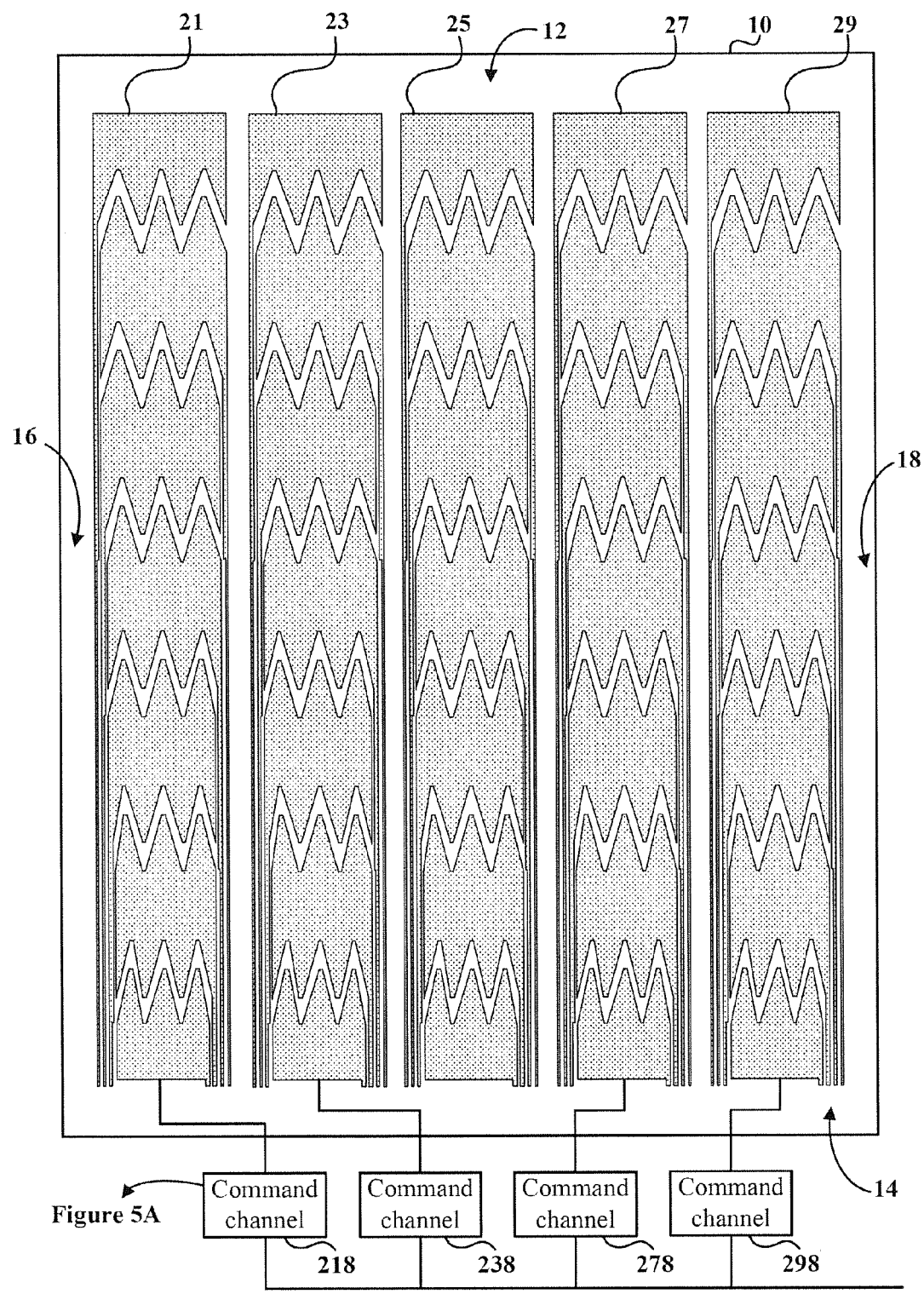
FIG. 5 shows a schematic diagram of the command channels in the touch panel according to a preferred embodiment of the present invention.

FIG. 5 shows a schematic diagram of the command channels in the touch panel according to a preferred embodiment of the present invention. As shown in the figure, the sensing structure of touch panel according to the present invention comprises command channels 218, 238, 278, 298 corresponding to the electrode groups 21, 23, 27, 29. The command channel 218 is coupled to the electrode group 21; the command channel 238 is coupled to the electrode group 23; the command channel 278 is coupled to the electrode group 27; and the command channel 298 is coupled to the electrode group 29. The command channels 218, 238, 278, 298 are parts of the touch key, such as the home or back key at the bottom of a general handheld electronic device. When the space between the electrode groups 21, 23, 25, 27, 29 and the command channels 218, 238, 278, 298 is touched, it is judged that the command channels 218, 238, 278, 298 are touched. For example, if the space between the electrode group 21 and the command channel 218 is touched, it is judged that the command channel 218 is touched, etc.

Figure 5A:
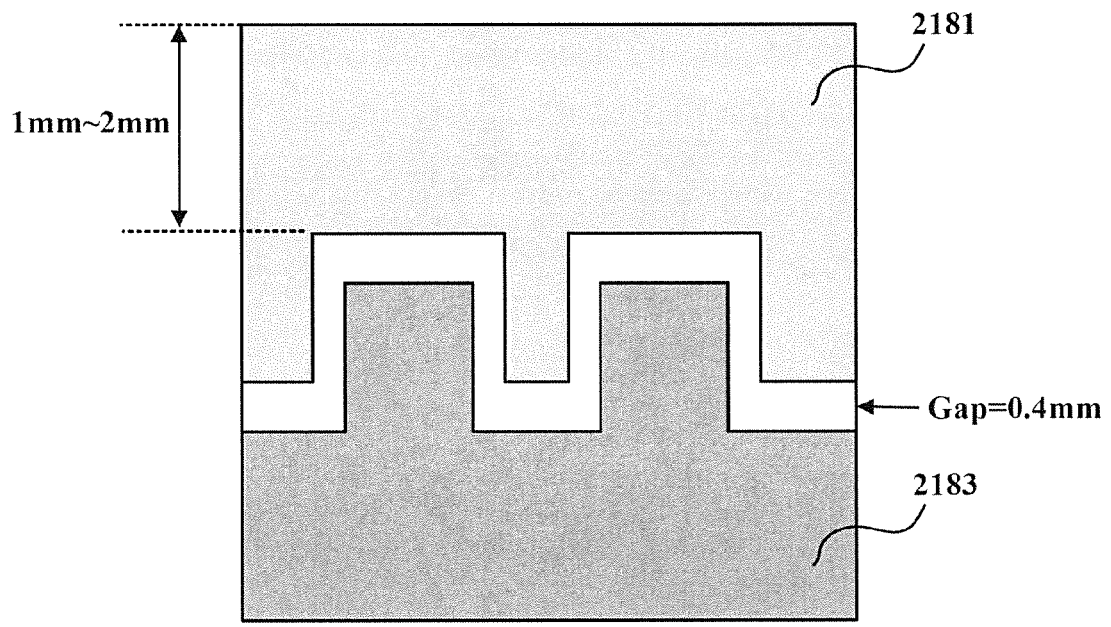
FIG. 5A shows a structural schematic diagram of the command channel in the touch panel according to a preferred embodiment of the present invention.

FIG. 5A shows a structural schematic diagram of the command channel in the touch panel according to a preferred embodiment of the present invention. The command channel 218 according to the present invention comprises a top electrode 2181 and a bottom electrode 2183 complementary and corresponding to each other. Besides, the gap between the top electrode 2181 and the bottom electrode 2183 is 0.4 millimeter; the width of the main part of the top electrode 2181 is selected from the range between 1 and 2 millimeters. Because the structures of the command channels 218, 238, 278, 298 are identical, only the command channel 218 is used for description in the present embodiment.

Moreover, when the wires of the sensing structure of touch panel according to the present invention run towards the second side 14 of the panel 10, which means that the chip receiving the signals of the wires is disposed below the second side 14, the command channels 218, 238, 278, 298 can be integrated on a flexible circuit board. When the wires of the sensing structure of touch panel according to the present invention run towards the first side 12 of the panel 10, which means that the chip receiving the signals of the wires is disposed above the first side 12, the command channels 218, 238, 278, 298 can be integrated on the touch panel.

To sum up, according to the present invention, by disposing the first external electrode, the second external electrode, and the internal electrodes, all being zigzag, in each electrode group, the disposable number of electrodes in each electrode group is increased. Thereby, the sensitivity of touch sensing for the sensing structure of touch panel and the multi-touch capability are enhanced. By disposing the wires with reduced widths, from 2 millimeters to 1 millimeter, on both sides of the electrode group alternately, the area occupied by the wires in each electrode group is reduced, and hence increasing the disposable number of electrodes in each electrode group.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A sensing structure of touch panel, comprising a plurality of electrode groups disposed on a substrate, said substrate having a first side and a second side corresponding to each other, and each said electrode group comprising:

a first external electrode, disposed on said first side, having a first external main electrode and a first external sub electrode, said first external sub electrode connected to one side of said first external main electrode, and said first external sub electrode being zigzag and facing said second side;

a second external electrode, disposed on said second side, having a second external main electrode and a second external sub electrode, said second external sub electrode connected to one side of said second external main electrode, and said second external sub electrode being zigzag and facing said first side; and a plurality of internal electrodes, disposed between said first external electrode and said second external electrode, having an internal main electrode, a first internal sub electrode, and a second internal sub electrode, respectively, said first internal sub electrode connected to one side of said internal main electrode, said first internal sub electrode being zigzag and facing said first side, said second internal sub electrode connected to the other side of said internal main electrode, said second internal sub electrode being zigzag and facing said second side, said plurality of internal electrodes arranged in series, said first internal sub electrode of a first internal electrode of said plurality of internal electrodes being complementary with and electrically isolated from said first external sub electrode, and said second internal sub electrode of the last internal electrode of said plurality of internal electrodes being complementary with and electrically isolated from said second external sub electrode, wherein there are gaps between said plurality of internal electrodes, respectively, and no other electrode is disposed between said external electrodes except said internal electrodes.

2. The sensing structure of claim 1, wherein said electrode group further comprises a plurality of wires, coupled to said first external electrode, said second external electrode, and said plurality of internal electrodes, respectively, extending from said first side to said second side, and disposed on both sides of said electrode group alternately.

3. The sensing structure of claim 2, wherein an initial width of said plurality of wires configured for coupling to said first external electrode, said second external electrode, and said plurality of internal electrodes is 0.2 millimeter, and a width of said plurality of wires are reduced from 0.2 millimeter to 0.1 millimeter after said plurality of wires pass a length of an adjacent internal electrode.

4. The sensing structure of claim 3, wherein a length of said internal electrode L1 is a length of each internal electrode along a direction from said first side to said second side, and the length of said internal electrode L1 is also defined as that $(L3-2*L4+L5) \div Number+L5$, where L3 is an overall length of said electrode group, L4 is a length of said external electrode, L5 is an overlap length, Number is a total number of said plurality of internal electrodes, said overlap length is a length of the complementary and an overlap portion between said first external sub electrode and said first internal sub electrode, between said second external sub electrode and said second internal sub electrode, or between said internal electrodes.

5. The sensing structure of claim 4, wherein the length of said external electrode is a length of said first external electrode or said second external electrode along the direction from said first side to said second side, and the length of said external electrode is also defined as that $L3 \div (Number+2)*0.75+0.5*L5$, where L3 is the overall length of said electrode group, Number is the total number of said plurality of internal electrodes L5 is said overlap length.

6. The sensing structure of claim 4, wherein said overlap length is selected from a range between 2 millimeters and 8 millimeters.

7. The sensing structure of claim 1, wherein said first external sub electrode, said second external sub electrode, said first internal sub electrode or said second internal sub electrode are zigzag electrodes comprising a plurality of trapezoid electrodes.

8. The sensing structure of claim 7, wherein a width of a top of said plurality of trapezoid electrodes and a spacing between said plurality of trapezoid electrodes are selected as 2 millimeters.

9. The sensing structure of claim 1, wherein a length of said first external main electrode or said second external main electrode along a direction from said first side to said second side is selected from a range between 2 millimeters to 4.5 millimeters.

10. The sensing structure of claim 1, wherein a length of said internal main electrode along a direction from said first side to said second side is selected from a range between 4 millimeters to 6 millimeters.

11. The sensing structure of claim 1, wherein said plurality of electrode groups are arranged in parallel on said substrate and a spacing therebetween is selected as 0.2 millimeter.

12. The sensing structure of claim 1, wherein said first external electrode, said second external electrode or said plurality of internal electrodes are indium-tin-oxide thin-film electrodes.

* * * * *